United States Patent
Hui et al.

(10) Patent No.: US 11,936,402 B2
(45) Date of Patent: *Mar. 19, 2024

(54) PUNCTURING OF POLAR CODES WITH COMPLEMENTARY SEQUENCES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 17/322,573

(22) Filed: May 17, 2021

(65) Prior Publication Data

US 2021/0273662 A1 Sep. 2, 2021

Related U.S. Application Data

(63) Continuation of application No. 16/497,062, filed as application No. PCT/IB2018/051935 on Mar. 22, 2018, now Pat. No. 11,012,102.

(60) Provisional application No. 62/476,452, filed on Mar. 24, 2017.

(51) Int. Cl.
*H03M 13/00* (2006.01)
*H03M 13/13* (2006.01)

(52) U.S. Cl.
CPC ....... *H03M 13/6362* (2013.01); *H03M 13/13* (2013.01)

(58) Field of Classification Search
CPC ............. H03M 13/6362; H03M 13/13; H03M 13/6368; H04L 1/0067; H04L 1/0068; H04L 1/0069
See application file for complete search history.

(56) References Cited

U.S. PATENT DOCUMENTS

| | | | |
|---|---|---|---|
| 2009/0028129 A1 | 1/2009 | Pi et al. | |
| 2014/0173376 A1 | 6/2014 | Jeong et al. | |
| 2016/0308644 A1* | 10/2016 | Shen | H04L 1/0057 |
| 2017/0012739 A1* | 1/2017 | Shen | H03M 13/2757 |

(Continued)

FOREIGN PATENT DOCUMENTS

EP 3113387 A1 1/2017

OTHER PUBLICATIONS

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

(Continued)

*Primary Examiner* — Christine T. Tu
(74) *Attorney, Agent, or Firm* — Withrow & Terranova, PLLC

(57) ABSTRACT

Systems and methods are disclosed herein for puncturing Polar-encoded bits. In some embodiments, a method of operation of a radio node that utilizes a Polar encoder comprising performing Polar encoding of a plurality of bits to provide a plurality of Polar-encoded code bits and puncturing the plurality of Polar-encoded code bits using a hybrid puncturing scheme to provide a plurality of rate-matched Polar-encoded code bits, wherein the hybrid puncturing scheme uses different puncturing patterns for different code rate regions.

12 Claims, 10 Drawing Sheets

(56) References Cited

U.S. PATENT DOCUMENTS

| | | | |
|---|---|---|---|
| 2017/0012740 A1 | 1/2017 | Shen et al. | |
| 2018/0199350 A1* | 7/2018 | John Wilson | ......... H04L 1/0057 |
| 2019/0081735 A1* | 3/2019 | Chen | ................... H03M 13/616 |
| 2019/0312676 A1 | 10/2019 | Jeong et al. | |

OTHER PUBLICATIONS

Ericsson, "R1-1704317: Rate Matching Schemes for Polar Codes," Third Generation Partnership Project (3GPP), TSG-RAN WG1 #88bis, Apr. 3-7, 2017, 5 pages, Spokane, USA.

Leroux, Camille, et al., "A Semi-Parallel Successive-Cancellation Decoder for Polar Codes," IEEE Transactions on Signal Processing, vol. 61, No. 2, Jan. 15, 2013, 10 pages.

MediaTek Inc., "R1-1701212: Polar Code Design Features for Control Channels," Third Generation Partnership Project (3GPP), TSG RAN WG1 AH_NR Meeting, Jan. 16-20, 2017, 9 pages, Spokane, USA.

Tal, Ido, et al., "List Decoding of Polar Codes," IEEE International Symposium on Information Theory Proceedings, St. Petersburg, 2011, pp. 1-5.

Wang, Runxin, et al., "A Novel Puncturing Scheme for Polar Codes," IEEE Communications Letters, vol. 18, No. 12, Dec. 2014, pp. 2081-2084.

Zhang, Liang, et al., "On the Puncturing Patterns for Punctured Polar Codes," IEEE International Symposium on Information Theory, IEEE, 2014, pp. 121-125.

ZTE et al., "R1-1701602: Rate Matching of Polar Codes for eMBB," Third Generation Partnership Project (3GPP), TSG RAN WG1 Meeting #88, Feb. 13-17, 2017, 20 pages, Athens, Greece.

International Search Report and Written Opinion for International Patent Application No. PCT/IB2018/051935, dated May 22, 2018, 17 pages.

Notice of Allowance for U.S. Appl. No. 16/497,062, dated Feb. 9, 2021, 7 pages.

Intention to Grant for European Patent Application No. 18715136.0, dated Oct. 19, 2021, 5 pages.

Extended European Search Report for European Patent Application No. 22154271.5, dated Mar. 14, 2022, 8 pages.

* cited by examiner

Example of polar code structure with N = 8

Polar code encoder with N = 8

*Rate matching mechanism with circular repetition*

Extraction from Circular Buffer: (a) No Puncturing; (b) Type-I Puncturing; (c) Type-II Puncturing

*Extraction from Circular Buffer: (a) No Puncturing; (b) Type-I Puncturing; (c) Type-II Puncturing*

PUNCTURING OF POLAR CODES WITH COMPLEMENTARY SEQUENCES

RELATED APPLICATIONS

This application is a continuation of U.S. patent application Ser. No. 16/497,062, filed Sep. 24, 2019, now U.S. Pat. No. 11,012,102, which is a 35 U.S.C. § 371 national phase filing of International Application No. PCT/IB2018/051935, filed Mar. 22, 2018, which claims the benefit of provisional patent application Ser. No. 62/476,452, filed Mar. 24, 2017, the disclosures of which are hereby incorporated herein by reference in their entireties.

TECHNICAL FIELD

The present disclosure relates to Polar codes and, in particular, to puncturing Polar codes.

BACKGROUND

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of Polar codes under SC is not competitive compared to other modern channel coding schemes such as Low-Density Parity-Check (LDPC) codes and Turbo codes. Later, a SC List (SCL) decoder is proposed in [2], which can approach the performance of an optimal Maximum-Likelihood (ML) decoder. By concatenating a simple Cyclic Redundancy Check (CRC) coding, it was shown that the performance of concatenated Polar code is competitive with that of well-optimized LDPC and Turbo codes. As a result, Polar codes are being considered as a candidate for future Fifth Generation (5G) wireless communication systems.

The main idea of Polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit-channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a Polar code. Loading the data into the proper information bit locations has a direct impact on the performance of a Polar code. An illustration of the structure of a length-8 Polar code is illustrated in FIG. 1.

FIG. 2 illustrates the labeling of the intermediate information bits $s_{l,i}$ where $l \in \{0,1, \ldots, n\}$ and $i \in \{0,1, \ldots, N-1\}$ during Polar encoding with N=8. The intermediate information bits are related by the following equation:

$$s_{l+1,i} = s_{l,i} \oplus s_{l,i+1}^l \text{ for } l \in \{0,1, \ldots, n-1\} \text{ and } i \in \{0,1, \ldots, N-1\},$$

with $s_{0,i} \equiv u_i$ being the information bits, and $s_{n,i} \equiv x_i$ being the code bits, for $i \in \{0,1, \ldots, N-1\}$.

A major limitation of conventional Polar codes is that the codeword length or code length must be a power of two. Puncturing of coded bits (i.e., dropping some coded bits without transmitting them) is a natural method to support the granularity in codeword length required in practice. Also, when the desired codeword length is only slightly over a power of two, it is more practical to just repeat some of the coded bits instead of demanding the receiver to operate at twice the codeword length, which in turn increases the latency and power consumption and imposes a more stringent hardware requirement on processing speed and memory. Such a process of generating codewords with any desired length (typically through puncturing or repetition) is referred to as a rate-matching process. It is unclear how puncturing and repetition of Polar encoded bits should be performed in an efficient manner while maintaining a close-to-optimum performance.

Different puncturing methods for Polar-encoded bits have been proposed in the literature, cf. [4] and [5]. Each of them performs well only in a limited code rate region but not in other region. In order to achieve good performance in a wide range of code rates, different unrelated puncturing methods may need to be used at different regions of code rate. As a result, the transmitter needs to store multiple sequence of puncturing patterns. This increases the storage and implementation complexity of the rate matching process. As such, there is a need for systems and methods for puncturing Polar-encoded bits that address these issues.

SUMMARY

Systems and methods are disclosed herein for puncturing Polar-encoded bits. In some embodiments, a method of operation of a radio node that utilizes a Polar encoder comprising performing Polar encoding of a plurality of bits to provide a plurality of Polar-encoded code bits and puncturing the plurality of Polar-encoded code bits using a hybrid puncturing scheme to provide a plurality of rate-matched Polar-encoded code bits, wherein the hybrid puncturing scheme uses different puncturing patterns for different code rate regions.

In some embodiments, the different puncturing patterns are mutually complementary puncturing patterns. Further, in some embodiments, puncturing the plurality of Polar-encoded bits using the hybrid puncturing scheme to provide the plurality of rate-matched Polar-encoded code bits comprises re-ordering the plurality of Polar-encoded code bits to provide a plurality of re-ordered Polar-encoded code bits, storing the plurality of re-ordered Polar-encoded code bits in a circular buffer or linear buffer, and extracting the plurality of rate-matched Polar-encoded code bits from the circular buffer or the linear buffer in accordance with one of the different puncturing patterns for one of the different code rate regions that comprises a desired code rate for the plurality of rate-matched Polar-encoded code bits. In some embodiments, the different puncturing patterns comprise a first puncturing pattern for a first code rate region and a second puncturing pattern for a second code rate region, wherein the first puncturing pattern and the second puncturing pattern are mutually complementary puncturing patterns. Further, the plurality of Polar-encoded code bits comprises N bits, and extracting the plurality of rate-matched Polar-encoded code bits from the circular buffer or the linear buffer comprises extracting a first M bits from the circular buffer or the linear buffer if the desired code rate for the plurality of rate-matched Polar-encoded code bits is in the first code rate region, and extracting M bits from the circular buffer or the linear buffer starting at an (N−M)-th bit of the circular buffer or the linear buffer if the desired code rate for the plurality of rate-matched Polar-encoded code bits is in the second code rate region, wherein M<N.

In some embodiments, the hybrid puncturing scheme uses a first puncturing scheme having a first puncturing pattern for a first code rate region and uses a second puncturing scheme having a second puncturing pattern for a second code rate region, the first puncturing pattern and the second puncturing pattern being mutually complementary puncturing patterns. Further, in some embodiments, puncturing the plurality of Polar-encoded code bits using the hybrid puncturing scheme to provide the plurality of rate-matched Polar-encoded code bits comprises re-ordering the plurality of Polar-encoded code bits to provide a plurality of re-ordered Polar-encoded code bits, storing the plurality of re-ordered Polar-encoded code bits in a circular buffer or linear buffer, and extracting the plurality of rate-matched Polar-encoded code bits from the circular buffer or the linear buffer in accordance with the first puncturing pattern for the first puncturing scheme if a desired code rate for the plurality of rate-matched Polar-encoded code bits is within the first code rate region or in accordance with the second puncturing pattern for the second puncturing scheme if the desired code rate for the plurality of rate-matched Polar-encoded code bits is within the second code rate region. In some other embodiments, the different puncturing patterns comprise the first puncturing pattern for the first code rate region and the second puncturing pattern for the second code rate region, wherein the first puncturing pattern and the second puncturing pattern are mutually complementary puncturing patterns; the plurality of Polar-encoded code bits comprises N bits; and puncturing the plurality of Polar-encoded code bits using the hybrid puncturing scheme to provide the plurality of rate-matched Polar-encoded code bits comprises re-ordering the plurality of Polar-encoded code bits to provide a plurality of re-ordered Polar-encoded code bits, storing the plurality of re-ordered Polar-encoded code bits in a circular buffer or linear buffer, extracting a first M bits from the circular buffer or the linear buffer as the plurality of rate-matched Polar-encoded code bits in accordance with the first puncturing pattern for the first puncturing scheme if a desired code rate for the plurality of rate-matched Polar-encoded code bits is within the first code rate region, and extracting M bits from the circular buffer or the linear buffer starting at an (N−M)-th bit of the circular buffer or the linear buffer as the plurality of rate-matched Polar-encoded code bits in accordance with the second puncturing pattern for the second puncturing scheme if the desired code rate for the plurality of rate-matched Polar-encoded code bits is within the second code rate region, wherein M<N.

In some embodiments, the method further comprises transmitting the plurality of rate-matched Polar-encoded code bits.

In some embodiments, a method of operation of a radio node that utilizes a Polar encoder comprises performing Polar encoding of a plurality of bits to provide a plurality of Polar-encoded code bits, re-ordering the plurality of Polar-encoded code bits to provide a plurality of re-ordered Polar-encoded code bits, storing the plurality of re-ordered Polar-encoded code bits in a circular buffer or linear buffer, extracting a first M bits from the circular buffer or the linear buffer as a plurality of rate-matched Polar-encoded code bits if a desired code rate for the plurality of rate-matched Polar-encoded code bits is within a first code rate region, and extracting M bits from the circular buffer or the linear buffer starting at an (N−M)-th bit of the circular buffer or the linear buffer as the plurality of rate-matched Polar-encoded code bits if the desired code rate for the plurality of rate-matched Polar-encoded code bits is within the second code rate region, wherein M<N.

In some embodiments, re-ordering the plurality of Polar-encoded code bits comprises re-ordering the plurality of Polar-encoded code bits in accordance with an ordered sequence that characterizes a first nested sequence of puncturing patterns for the first code rate region, wherein the first nested sequence of puncturing patterns for the first code rate region and a second nested sequence of puncturing patterns for the second code rate region are mutually complementary.

Embodiments of a radio node are also disclosed. In some embodiments, a radio node that utilizes a Polar encoder is adapted to perform Polar encoding of a plurality of bits to provide a plurality of Polar-encoded code bits, and puncture the plurality of Polar-encoded code bits using a hybrid puncturing scheme to provide a plurality of rate-matched Polar-encoded code bits, wherein the hybrid puncturing scheme uses different puncturing patterns for different code rate regions.

In some embodiments, a radio node that utilizes a Polar encoder is adapted to perform Polar encoding of a plurality of bits to provide a plurality of Polar-encoded code bits, re-order the plurality of Polar-encoded code bits to provide a plurality of re-ordered Polar-encoded code bits, store the plurality of re-ordered Polar-encoded code bits in a circular buffer or linear buffer, extract a first M bits from the circular buffer or the linear buffer as a plurality of rate-matched Polar-encoded code bits if a desired code rate for the plurality of rate-matched Polar-encoded code bits is within a first code rate region, and extract M bits from the circular buffer or the linear buffer starting at an (N−M)-th bit of the circular buffer or the linear buffer as the plurality of rate-matched Polar-encoded code bits if the desired code rate for the plurality of rate-matched Polar-encoded code bits is within the second code rate region, wherein M<N.

In some embodiments, the radio node is further adapted to re-order the plurality of Polar-encoded code bits in accordance with an ordered sequence that characterizes a first nested sequence of puncturing patterns for the first code rate region, wherein the first nested sequence of puncturing patterns for the first code rate region and a second nested sequence of puncturing patterns for the second code rate region are mutually complementary.

In some embodiments, a radio node that utilizes a Polar encoder comprises a Polar encoder operable to perform Polar encoding of a plurality of bits to provide a plurality of Polar-encoded code bits, and circuitry associated with the Polar encoder that is operable to puncture the plurality of Polar-encoded code bits using a hybrid puncturing scheme to provide a plurality of rate-matched Polar-encoded code bits, wherein the hybrid puncturing scheme uses different puncturing patterns for different code rate regions.

In some embodiments, a radio node that utilizes a Polar encoder comprises a Polar encoder operable to perform Polar encoding of a plurality of bits to provide a plurality of Polar-encoded code bits, and circuitry associated with the Polar encoder that is operable to re-order the plurality of Polar-encoded code bits to provide a plurality of re-ordered Polar-encoded code bits, store the plurality of re-ordered Polar-encoded code bits in a circular buffer or linear buffer, extract a first M bits from the circular buffer or the linear buffer as a plurality of rate-matched Polar-encoded code bits if a desired code rate for the plurality of rate-matched Polar-encoded code bits is within a first code rate region, and extract M bits from the circular buffer or the linear buffer starting at an (N−M)-th bit of the circular buffer or the linear buffer as the plurality of rate-matched Polar-encoded code bits if the desired code rate for the plurality of rate-matched Polar-encoded code bits is within the second code rate region, wherein M<N.

In some embodiments, the circuitry is further adapted to re-order the plurality of Polar-encoded code bits in accordance with an ordered sequence that characterizes a first nested sequence of puncturing patterns for the first code rate region, wherein the first nested sequence of puncturing patterns for the first code rate region and a second nested sequence of puncturing patterns for the second code rate region are mutually complementary.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
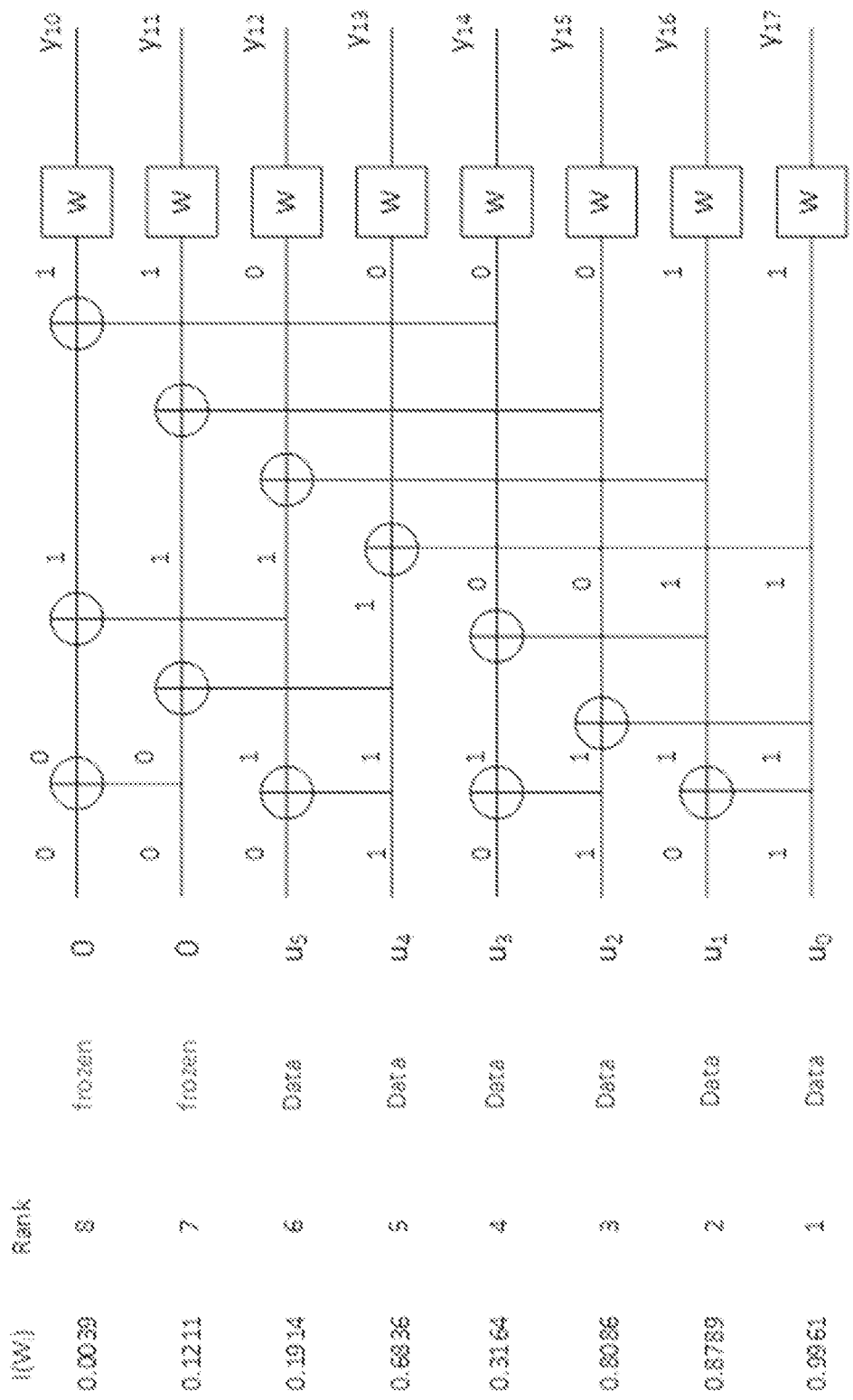
FIG. 1 is an illustration of the structure of a length-8 Polar code.
Figure 2:
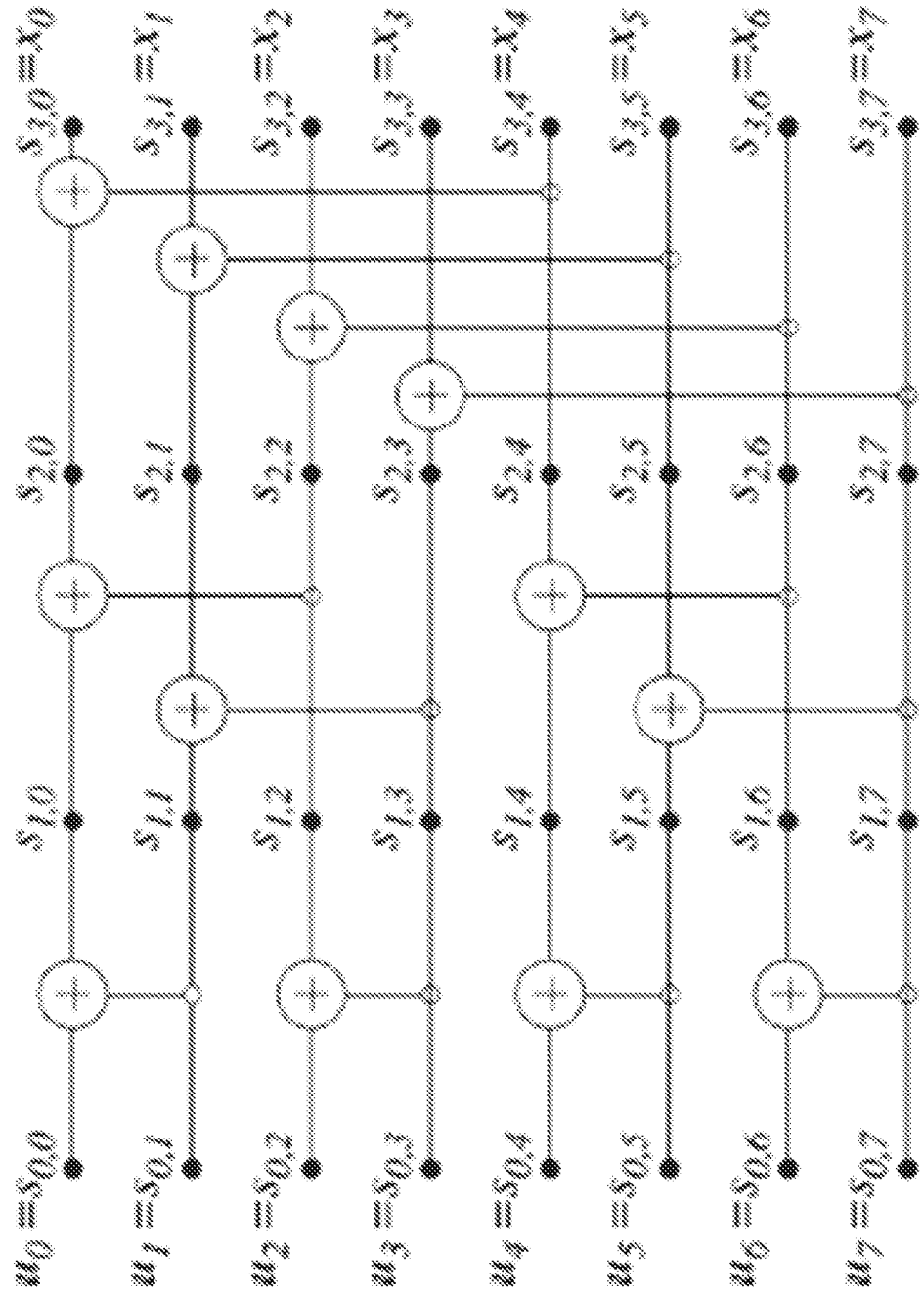
FIG. 2 illustrates the labeling of the intermediate information bits $s_{l,i}$, where $l \in \{0, 1, \ldots, n\}$ and $i \in \{0, 1, \ldots, N-1\}$ during Polar encoding with N=8.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Embodiments of the present disclosure relate to the use of a pair of mutually complementary sequences of puncturing patterns to determine the locations of punctured Polar-encoded bits (i.e., code bits). One of the sequences is used for one code rate region (e.g., low-rate region), while the other sequence is used for another code rate region (e.g., high-rate region). The determination of which sequence of puncturing patterns to use may be based on a predetermined threshold on code rate. The main advantage of using a pair of complementary sequences is that both sequences can be described and thus stored by a single ordered code bit index sequence that specifies the index of code bit at a given relative ranking. Further, the single ordered code bit index sequence facilitates an implementation of rate matching based on circular or linear buffer.

A key advantage of the present disclosure is that only a single sequence of ordered index needs to be stored for the rate-matching process. As a result, the coded bits may be first permuted according to the single index sequence of code bits before being written into a circular or linear buffer. The starting and ending addresses in the circular/linear buffer, as well as the direction of extraction, may be determined based on which sequence of puncturing patterns is used in order to extract the code bits from the buffer.

Nested Information Sets

In order to encode a block of K data bits, the encoder of a Polar code of length N must first determine the information set $A_K^N$ that specifies when bit-channels are frozen and which bit-channels are used to carry the data bits at the input of the encoder. For Additive White Gaussian Channels (AWGN), the sequence of information sets $\{A_K^N: K=0,1,\ldots,N\}$ is nested for different values of K in the sense that $A_0^N \subset A_1^N \subset A_2^N \subset \ldots \subset A_N^N$. Such a nested sequence of information sets can be characterized by an ordered bit-channel index sequence Q: $\{1,2,\ldots,N\} \to \{1,2,\ldots,N\}$, which specifies the index of the bit-channel of a given rank such that Q(i) denotes the index of the ith highest ranked bit-channel. The ranking of different bit-channels may be determined by their relative reliabilities, as measured by bit-error probability for example, in carrying a data bit. Such an ordered bit-channel may be predetermined and stored at both the Polar encoder and the Polar decoder. Such a sequence may also be equivalently represented (and stored) by an ordered bit-channel ranking sequence $Q^{-1}$: $\{1,2,\ldots,N\} \to \{1,2,\ldots,N\}$ that provides the rank of the bit-channel of a given index. The ordered bit-channel ranking sequence is the inverse of the ordered bit-channel index sequence in the sense that $Q^{-1}(Q(i))=i$ and $Q(Q^{-1}(i))=i$.

Nested Puncturing

In order to attain a target block length M that is not a power of two, the output of the encoder of a Polar code of length $N^{\lceil \log_2 M \rceil}$ may need to be punctured so that the $p\equiv(N-M)$ punctured bits are not transmitted to the receiver. The encoder of a Polar code that supports arbitrary block length M needs to determine the set $B_p^N \subset \{0,1,2,\ldots,N-1\}$ of indices of code bits to be punctured. This set $B_p^N$ is often referred to as a puncturing pattern, i.e. a set of p punctured code bit indices applied to a mother code of length N to attain the target code length of $M=N-p$. In principle, to support all possible code lengths, the collection $\{B_p^N : p=1, 2, \ldots, N-1\}$ of puncturing patterns must be stored or computed on-the-fly for all the supported values of mother code length N. To reduce storage requirements, we consider only sequences of nested puncturing patterns that satisfy:

Nested Puncturing Property: $B_p^N \subset B_q^N$ whenever $p \leq q$

The nested puncturing property implies that $B_0^N \subset B_1^N \subset B_2^N \subset \ldots \subset B_N^N$. This nested puncturing property mirrors the nested information-set property used to derive the information bit locations for different code rates at the encoder input.

A collection of puncturing patterns $\{B_p^N\}$ that satisfy this property is referred to herein as a sequence of nested puncturing patterns. Only puncturing methods that generate a nested sequence of puncturing patterns $\{B_p^N : p=0,1,\ldots,N\}$ are considered since a nested sequence of punctured patterns is suitable for implementation in a circular or linear buffer, as will be further illustrated later. Such a nested sequence of puncturing patterns can be characterized by an ordered code bit index sequence Z: $\{1,2,\ldots,N\} \to \{1,2,\ldots,N\}$, which specifies the index of the code bit of a given rank such that $Z(i)$ denotes the index of ith lowest ranked code bit. For example, the punctured pattern may be related to the ordered code bit index sequence simply by $B_p^N = \{Z(i) : i=1,2,\ldots,p\}$, but other ways of relating them are also possible. Such a sequence may also be equivalently represented (and stored) by an ordered code bit ranking sequence $Z^{-1}: \{1,2,\ldots,N\} \to \{1,2,\ldots,N\}$ that provides the rank of the code bit of a given index. The ordered code bit ranking sequence is the inverse of the ordered code bit index sequence in the sense that $Z^{-1}(Z(i))=i$ and $Z(Z^{-1}(i))=i$.

Similar to the nested information-set sequence, to store a sequence of nested puncturing patterns, one only needs to store an ordered code bit index sequence Z: $\{1,2,\ldots,N\} \to \{1,2,\ldots,N\}$, such that $Z(p) \in B_p^N / B_{p-1}^N$ (which contains only one element and thus uniquely defines the value of $Z(p)$) with $B_0^N$ being an empty set and $B_N^N = \{0,1,2,\ldots,N-1\}$. Most of the existing puncturing schemes (or sequence of puncturing patterns) for Polar codes satisfy the nested puncturing property.

Types of Nested Puncturing

Among the puncturing schemes that satisfy the nested puncturing property, we further focus on two types:
Type I: Puncturing from Start—Begin puncturing from index 0, i.e. $B_1^N = \{0\}$
Type II: Puncturing from End—Begin puncturing from index N-1, i.e. $B_1^N = \{N-1\}$
As illustrated below, only these two types of puncturing schemes can exhibit symmetry between punctured indices at the output and those at the input of the encoder. As dem-onstrated later, Type I puncturing typically performs better at low code rates while Type II often performs better at high code rates.

One aspect of embodiments of the present disclosure is to use a hybrid puncturing scheme where a puncturing scheme of Type I is used for one region of code rate (e.g., low code rate region), and another puncturing scheme of Type II is used for another region of code rate (e.g., high code rate region), while the puncturing patterns produced by these two puncturing schemes (one of Type I and another of Type II) are closely related and can be generated by a single ordered code bit index sequence $Z(\bullet)$, as it is further described below.

Relationship with Information Set

For each puncturing pattern $B_p^N$, there is a corresponding set $C_p^N$ of p bit-channel indices that should be frozen, or excluded from carry data bits, at the input of a Polar encoder in order to ensure that the resulting generator matrix has full rank and that the data bits are decodable with a Successive Cancellation (List) (SC(L)) decoder. In general, $C_p^N$ may overlap with the information set 4 used to indicate the locations of the bit-channels where K data bits are carried. In this case, the information set should be adjusted to avoid selecting bit-channels with indices in $C_p^N$ to carry data. For example, when an information set is chosen based on an ordered bit-channel index sequence $Q(\bullet)$, indices indicated by $Q(\bullet)$ that fall in the set $C_p^N$ should be skipped when choosing the information set.

In some cases, $C_p^N$ can be chosen exactly equal to $B_p^N$, but it is not true in general. For convenience, a puncturing pattern $B_p^N$ is referred to as reciprocal if $C_p^N$ can be chosen as $B_p^N$, and a puncturing method is referred to as reciprocal if it results in a sequence of puncturing patterns $\{B_p^N\}$ for a different number p of punctured bits such that $B_p^N = C_p^N$ for each $p=1, 2, \ldots, N$.

The reciprocal property is desirable as only one set of ordered index sequence is needed for both input and output of the encoder in order to implement the puncturing scheme. Hence we further restrict our consideration on reciprocal, nested puncturing methods. Now we provide equivalent characterizations of reciprocal puncturing patterns of Type I and Type II, respectively.

For Type I puncturing (i.e., from start), it can be shown that a necessary and sufficient condition for $\{B_p^N\}$ to be reciprocal is that it satisfies One-covering Property: If $i \in B_p^N$ and $i \succeq_1 j$, then $j \in B_p^N$
where $i \succeq_1 j$ means that for every digit of '1' in the binary representation of index j, the corresponding digit in the index i must also be '1'. Intuitively, this means that i has as least as many "1" as j does in the binary representation. For convenience of description, we refer this as i "one-covers" j. For example, the index with binary representation '1001' one-covers '0001', '1000', and '0000'.

Similarly, for Type II puncturing (i.e., from end), a necessary and sufficient condition for $\{B_p^N\}$ to be reciprocal is that it satisfies Zero-covering Property: If $i \in B_p^N$ and $i \succeq_0 j$, then $j \in B_p^N$
where $i \succeq_0 j$ means that for every digit of '0' in the binary representation of index j, the corresponding digit in the index i must also be '0'. Intuitively, this means that i has at least as many "0" as j does in the binary representation. For convenience of description, we refer this as i "zero-covers" j. For example, the index with binary representation '1001' one-covers '1101', '1011', and '1111'.

It can be verified that most of the existing puncturing methods for Polar codes to date yield a sequence of puncturing patterns, each satisfying one of these two properties.

Complementary Puncturing Patterns

Type I and Type II puncturing schemes typically come in pair. Given a sequence of puncturing patterns $\{B_p^N: p=1, 2, \ldots, N\}$ of one of the two types, a complementary sequence of puncturing patterns $\{\overline{B}_p^N: p=1, 2, \ldots, N\}$ of the other type can be obtained by $$\overline{B}_p^N = (B_{N-p}^N)^c \text{ for } p=0,1,2,\ldots,N,$$

where $X^c$ denotes the complement of set X. Since the complementary puncturing pattern of a puncturing pattern $\overline{B}_p^N$ that is complementary to $B_p^N$ is equal to $B_p^N$ itself, we refer to a pair of complementary puncturing schemes of Type I and Type II, respectively, as mutually complementary puncturing patterns.

If a sequence of nested puncturing patterns $\{B_p^N: p=1, 2, \ldots, N\}$ is specified by the ordered code bit index sequence $Z: \{1,2, \ldots, N\} \to \{1,2, \ldots, N\}$, such that $Z(p) \in B_p^N / B_{p-1}^N$ and $B_p^N = \{Z(i): i=1,2,\ldots,p\}$, then the same ordered index sequence $Z(\cdot)$ can be used to generate the complementary puncturing patterns $\{\overline{B}_p^N: p=1,2,\ldots,N\}$ by computing $\overline{B}_p^N = \{Z(N-i+1): i=1,2,\ldots,p\}$ for each $p=1, 2, \ldots, N$. Hence, only a single ordered index sequence $Z: \{1,2, \ldots, N\} \to \{1,2, \ldots, N\}$ needs to be stored to generate two sequences of mutually complementary puncturing patterns, one of Type I and one of Type II. One aspect of embodiments of the present disclosure is to use a hybrid puncturing scheme where a puncturing scheme of Type I is used for one region of code rate (e.g., low code rate region) and another puncturing scheme of Type II is used for another region of code rate (e.g., high code rate region), while these puncturing patterns are chosen to be mutually complementary. This allows an efficient implementation of the overall puncturing process via circular or linear buffer as described below.

According to a preferred embodiment and as an example, the puncturing scheme of Type I in a preferred hybrid puncturing scheme is chosen as $$B_p^N = \begin{cases} \{0, 1, 2, \ldots, p-1\} & \text{for } 0 \le p \le \frac{N}{4} \\ \left\{0, 1, 2, \ldots, \frac{N}{4} + \left\lceil \frac{p - \frac{N}{4}}{2} \right\rceil - 1\right\} \cup \left\{\frac{N}{2}, \frac{N}{2}+1, \ldots, \frac{N}{2} + \left\lceil \frac{p - \frac{N}{4}}{2} \right\rceil - 1\right\} & \text{for } \frac{N}{4} < p < \frac{3N}{4} \\ \{0, 1, 2, \ldots, p-1\} & \text{for } \frac{3N}{4} \le p \le N \end{cases}$$

and its complement of Type II can be obtained from the above equation as

In other words, this scheme of either Type I or Type II splits the punctured bit indices in the middle two quarter of all indices, but different types start puncturing from different directions.

Circular/Linear Buffer Implementation

Nested puncturing patterns are suitable for circular or linear buffer implementation. A block of $N=2^{\lceil \log_2 M \rceil}$ code bits can be generated regardless of the target code length M and be loaded into a circular or linear buffer according to the ordered index sequence $\{Z(p)\}$. The desired M code bits can then be extracted from the buffer with a starting location and/or an ending location specified by the specific puncturing method.

Figure 3:
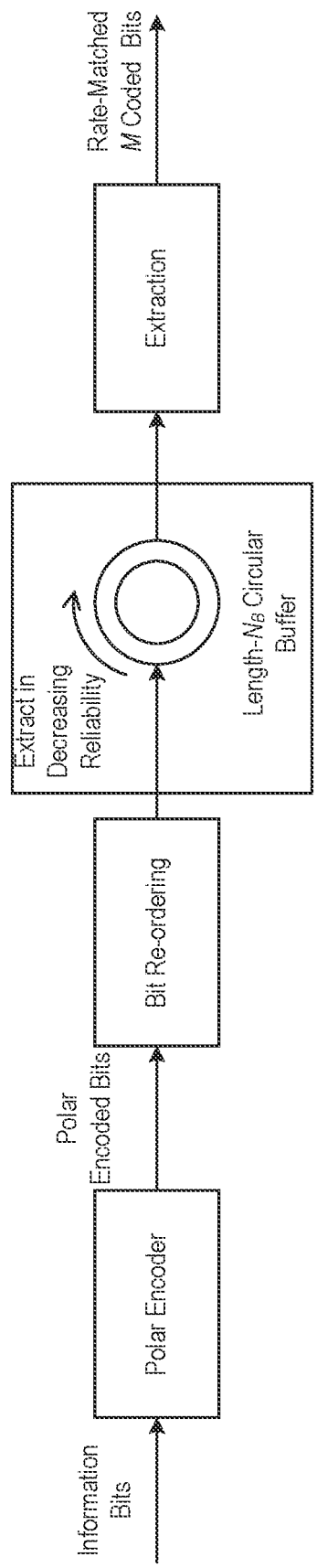
FIG. 3 shows a possible block diagram on the process of how the desired M code bits can be generated.

For example, FIG. 3 shows a possible block diagram on the process of how the desired M code bits can be generated. The Polar encoder first generates N code bits based on an information set, and these code bits are re-ordered according to the ordered index sequence $\{Z(p)\}$ which is used to generate the nested puncturing patterns. The re-ordered code bits are then sequentially loaded into a circular or linear buffer. M code bits are then extracted from the circular buffer depending on the type of puncturing method used.

In the case when a single puncturing method (Type I and/or Type II) is employed, the bit-reordering block is based on the same sequence $\{Z(p)\}$ and need not be changed, which is desirable. The use of a single puncturing method (or ordered index sequence $\{Z(p)\}$) still allows both Type I and Type II variants of the method to be used for different code rate regions in order to exploit their relative strengths.

Figure 4:
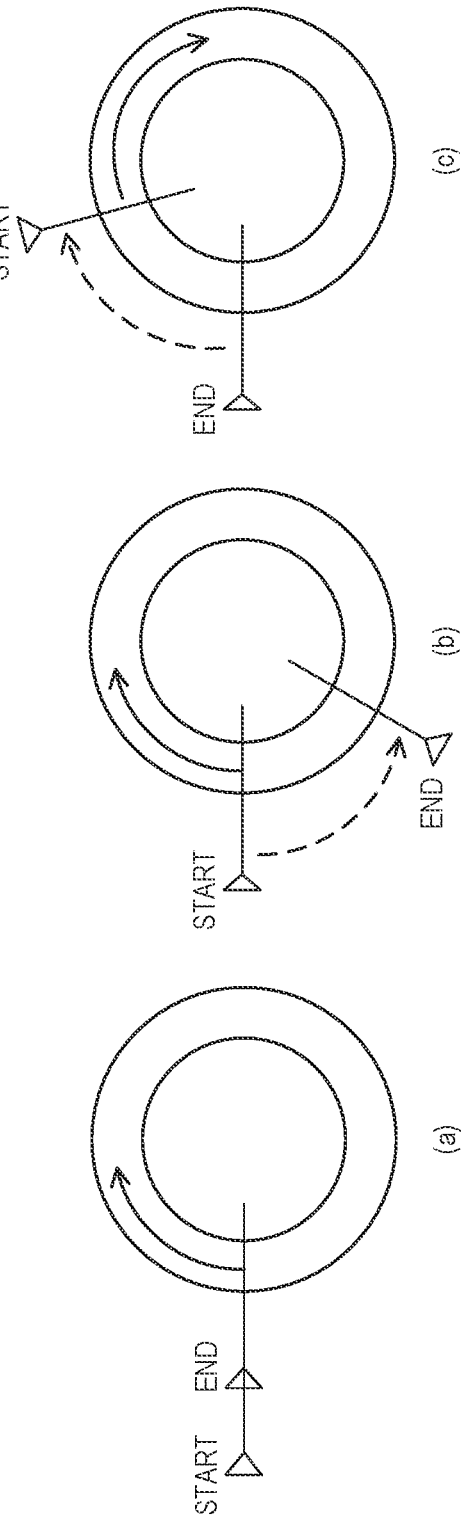
FIG. 4 illustrates that the extraction process from the circular or linear buffer can be specified by the starting and ending locations in the circular buffer.

The extraction process from the circular or linear buffer can be specified by the starting and ending locations in the circular buffer, as illustrated in FIG. 4. For Type I puncturing, the ending location of the extraction process is adjusted according to the desired number M of code bits, while for Type II puncturing the starting location is adjusted. The dashed arrow depicts how the starting (start) and ending (end) location are adjusted compared to the case with no puncturing. Similar operations apply for linear buffer as opposed to circular buffer.

Figure 5:
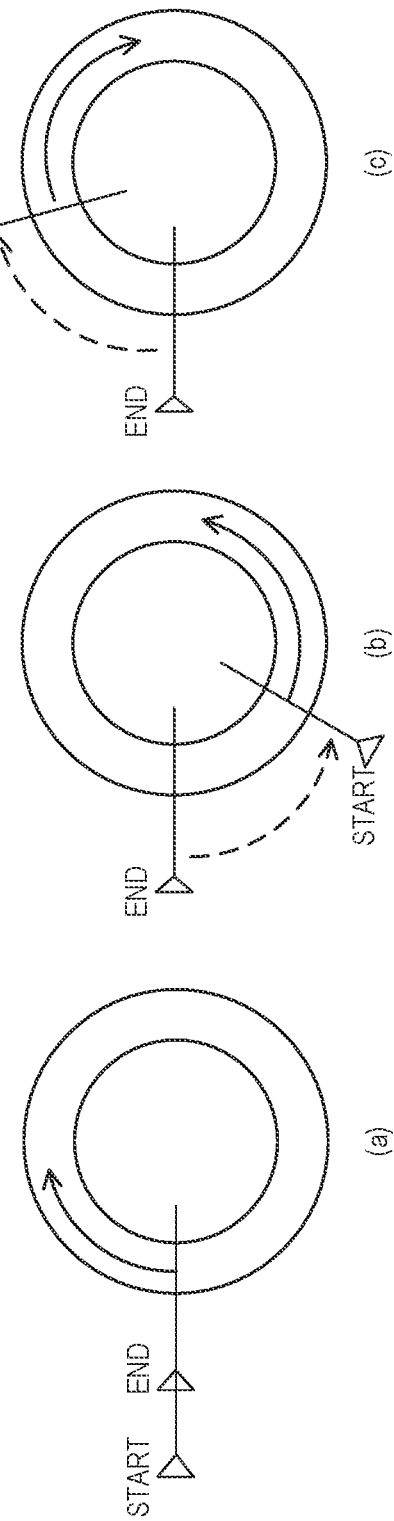
FIG. 5 illustrates that the direction of extracting code bits from the circular buffer may depend on the type of puncturing employed.

Alternatively, the direction of extracting code bits from the circular buffer may depend on the type of puncturing $$\overline{B}_p^N = (B_{N-p}^N)^c = \begin{cases} \{N-p, N-p+1, \ldots, N-1\} & \text{for } 0 \le p \le \frac{N}{4} \\ \left\{\frac{3N}{4} - \left\lceil \frac{p - \frac{N}{4}}{2} \right\rceil, \ldots, N-1\right\} \cup \left\{\frac{N}{2} - \left\lceil \frac{p - \frac{N}{4}}{2} \right\rceil, \ldots, \frac{N}{2} - 1\right\} & \text{for } \frac{N}{4} < p < \frac{3N}{4} \\ \{N-p, N-p+1, \ldots, N-1\} & \text{for } \frac{3N}{4} \le p \le N \end{cases}$$

employed. For example, in FIG. 5, for Type I puncturing, the starting position is adjusted according to the desired number M of code bits, and the direction of extracting code bits from the buffer is also changed (to counter-clockwise). Other ways of reading off the content from the circular buffer based on the type of puncturing are also possible. The main point is that both the content (i.e., code bits) and the ordering of the content do not need to change according to the type of puncturing and on the code rate.

Embodiments of the present disclosure provide a hybrid puncturing scheme where a puncturing scheme of Type I is used for one region of code rate (e.g., low code rate region) and another puncturing scheme of Type II is used for another region of code rate (e.g., high code rate region), while these puncturing patterns are chosen to be mutually complementary. This allows an efficient implementation of the overall puncturing process via circular or linear buffer.

Example System and Operation Thereof

Figure 6:
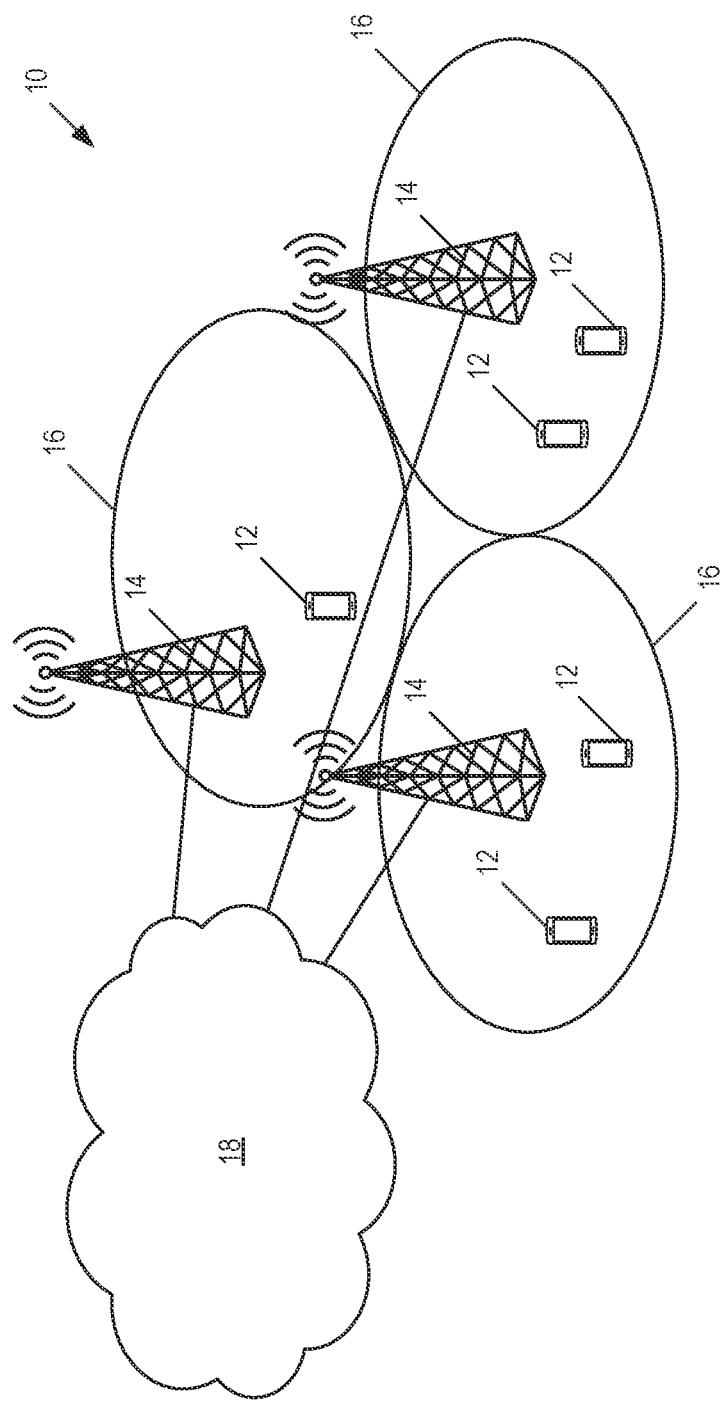
FIG. 6 illustrates one example of a cellular communications network (e.g., a Long Term Evolution (LTE) (e.g., LTE Advanced (LTE-A), LTE-Pro, or an enhanced version of LTE) or Fifth Generation (5G) New Radio (NR) network) in which embodiments of the present disclosure may be implemented.

FIG. 6 illustrates one example of a cellular communications network 10 (e.g., an LTE (e.g., LTE Advanced (LTE-A), LTE-Pro, or an enhanced version of LTE) or 5G NR network) in which embodiments of the present disclosure may be implemented. As illustrated, a number of wireless devices 12 (e.g., UEs, Bandwidth reduced Low complexity (BL)/Coverage Enhanced (CE) UEs) wirelessly transmit signals to and receive signals from radio access nodes 14 (e.g., eNBs or gNBs, which is a 5G NR base station), each serving one or more cells 16. The radio access nodes 14 are connected to a core network 18.

Figure 7:
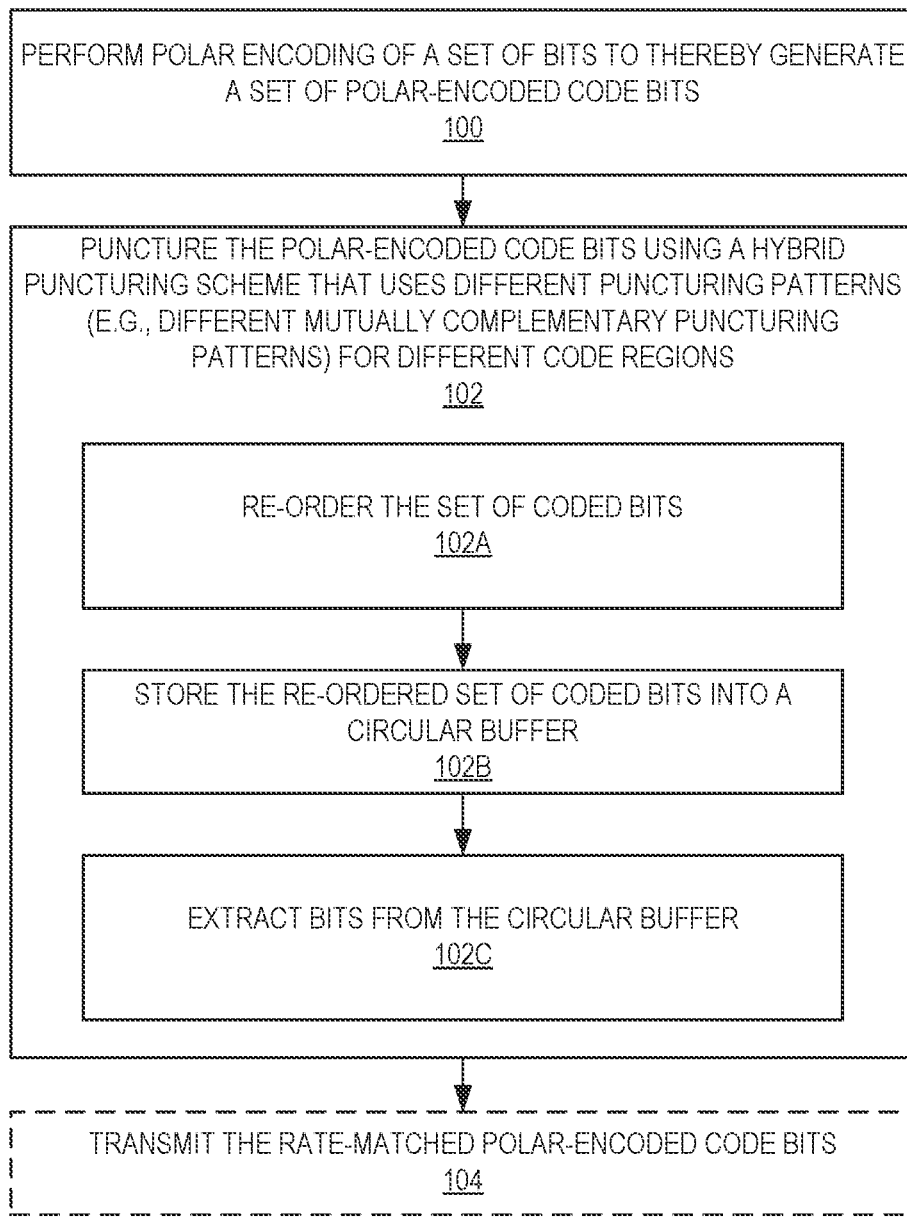
FIG. 7 is a flow chart that illustrates the operation of a radio node (e.g., a radio access node or a wireless device) according to some embodiments of the present disclosure.

FIG. 7 is a flow chart that illustrates the operation of a radio node (e.g., a radio access node 14 or a wireless device 12) according to some embodiments of the present disclosure. As illustrated, the radio node performs Polar encoding of a set of bits to thereby generate a set of Polar-encoded code bits (step 100). The radio node punctures the set of Polar-encoded code bits using a hybrid puncturing scheme that uses different puncturing patterns (e.g., different mutually complementary puncturing patterns) for different code regions, as described above (step 102). In some embodiments, puncturing the set of Polar-encoded code bits comprises re-ordering the plurality of Polar-encoded code bits to provide a plurality of re-ordered Polar-encoded code bits (step 102A), storing the plurality of re-ordered Polar-encoded code bits in a circular buffer or linear buffer (step 102B), and extracting the plurality of rate-matched Polar-encoded code bits from the circular buffer or the linear buffer in accordance with one of the different puncturing patterns for one of the different code regions that comprises a desired code rate for the plurality of rate-matched Polar-encoded code bits, as described above (step 102C).

In some embodiments, the hybrid puncturing scheme uses a Type I puncturing scheme having a first puncturing pattern for a first code rate region and uses a Type II puncturing scheme having a second puncturing pattern for a second code rate region, the first puncturing pattern and the second puncturing pattern being mutually complementary puncturing patterns. Further, in some embodiments, extracting the plurality of rate-matched Polar-encoded code bits from the circular buffer or the linear buffer in accordance with the first puncturing pattern for the Type I puncturing scheme if a desired code rate for the plurality of rate-matched Polar-encoded code bits is within the first code rate region or in accordance with the second puncturing pattern for the Type II puncturing scheme if the desired code rate for the plurality of rate-matched Polar-encoded code bits is within the second code rate region.

In some embodiments, the radio node transmits the rate-matched Polar-encoded code bits (step 104). Note that optional steps are indicated by dashed lines.

Figure 8:
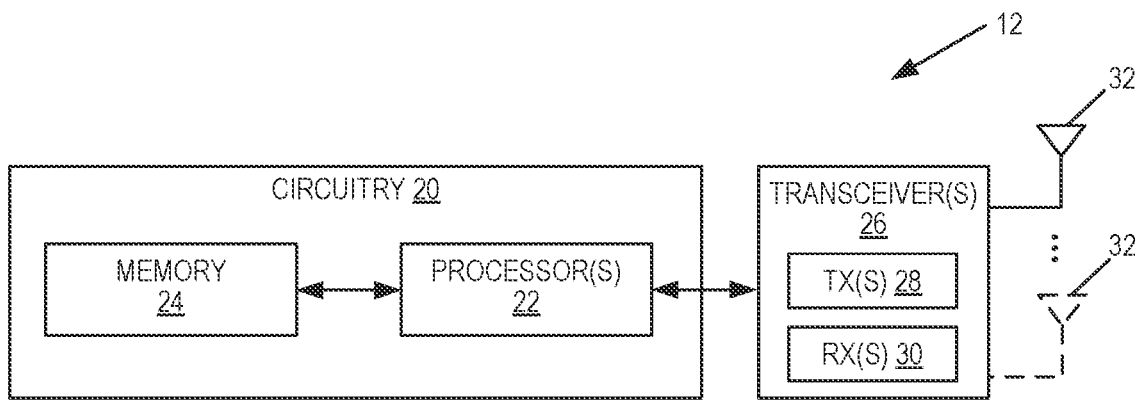
FIGS. 8 and 9 illustrate example embodiments of a wireless device.

FIG. 8 is a schematic block diagram of the wireless device 12 (e.g., UE) according to some embodiments of the present disclosure. As illustrated, the wireless device 12 includes circuitry 20 comprising one or more processors 22 (e.g., Central Processing Units (CPUs), Application Specific Integrated Circuits (ASICs), Field Programmable Gate Arrays (FPGAs), Digital Signal Processors (DSPs), and/or the like) and memory 24. The wireless device 12 also includes one or more transceivers 26 each including one or more transmitters 28 and one or more receivers 30 coupled to one or more antennas 32. In some embodiments, the functionality of the wireless device 12 described above may be implemented in hardware (e.g., via hardware within the circuitry 20 and/or within the processor(s) 22) or be implemented in a combination of hardware and software (e.g., fully or partially implemented in software that is, e.g., stored in the memory 24 and executed by the processor(s) 22).

In some embodiments, a computer program including instructions which, when executed by the at least one processor 22, causes the at least one processor 22 to carry out at least some of the functionality of the wireless device 12 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 9:
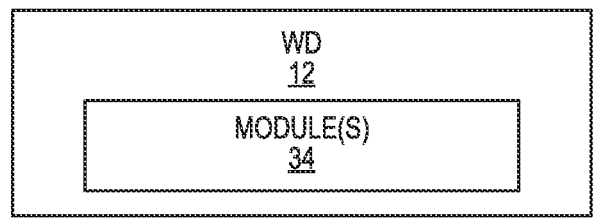

FIG. 9 is a schematic block diagram of the wireless device 12 (e.g., UE) according to some other embodiments of the present disclosure. The wireless device 12 includes one or more modules 34, each of which is implemented in software. The module(s) 34 provide the functionality of the wireless device 12 described herein.

Figure 10:
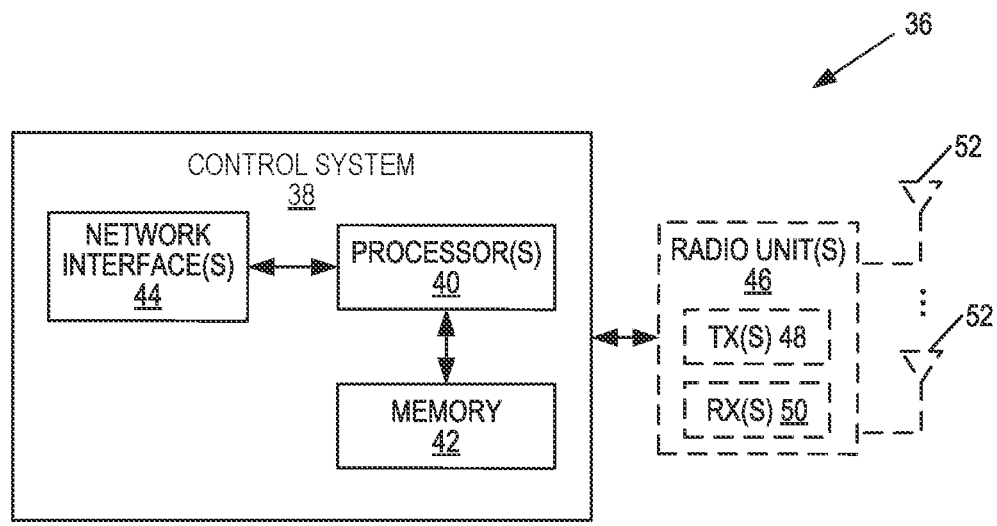
FIGS. 10 through 12 illustrate example embodiments of a network node.

FIG. 10 is a schematic block diagram of a network node 36 (e.g., a radio access node 14 such as, for example, an eNB or gNB) or a core network node according to some embodiments of the present disclosure. As illustrated, the network node 36 includes a control system 38 that includes circuitry comprising one or more processors 40 (e.g., CPUs, ASICs, DSPs, FPGAs, and/or the like) and memory 42. The control system 38 also includes a network interface 44. In embodiments in which the network node 36 is a radio access node 14, the network node 36 also includes one or more radio units 46 that each include one or more transmitters 48 and one or more receivers 50 coupled to one or more antennas 52. In some embodiments, the functionality of the network node 36 described above may be fully or partially implemented in software that is, e.g., stored in the memory 42 and executed by the processor(s) 40.

Figure 11:
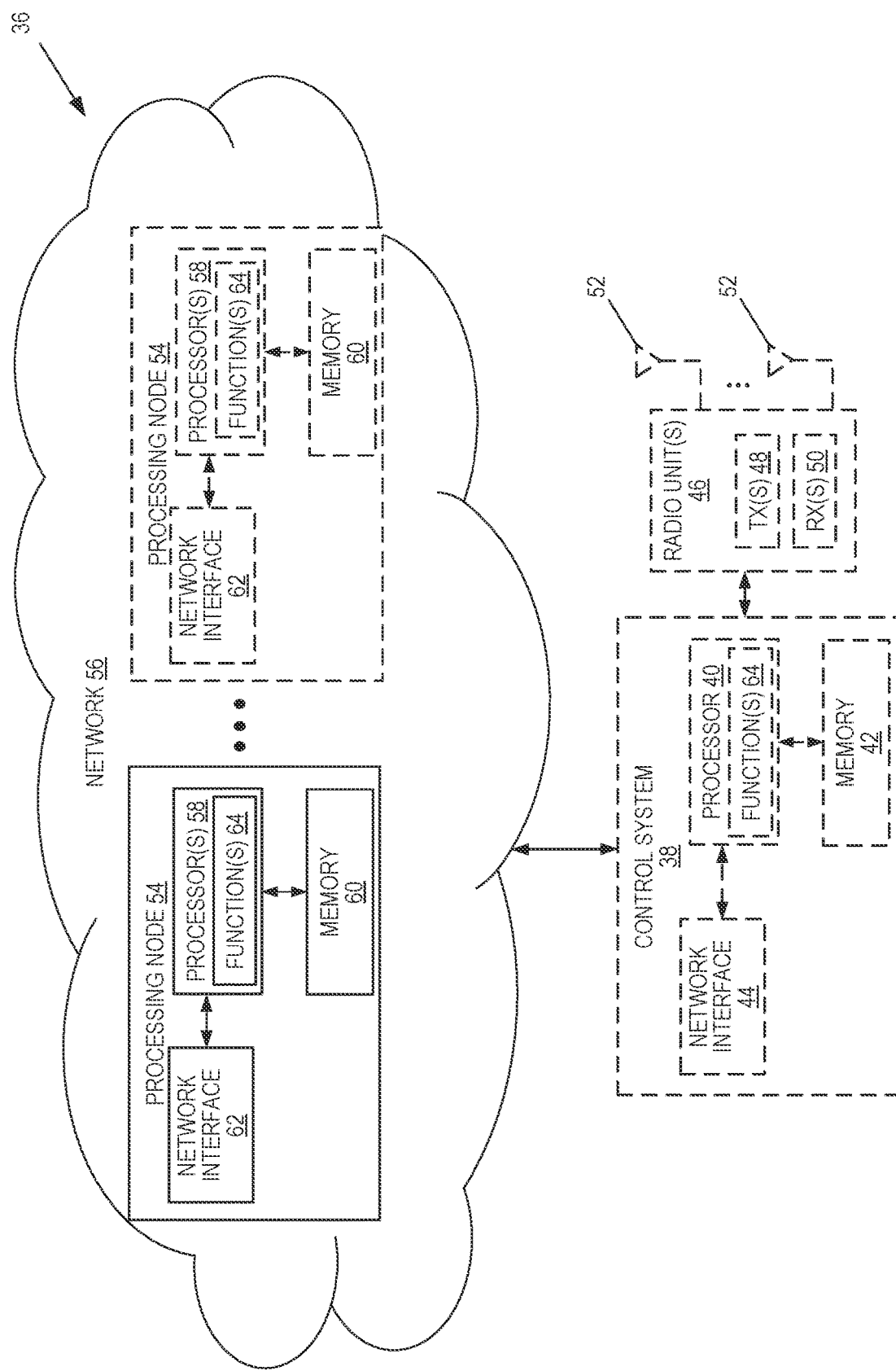

FIG. 11 is a schematic block diagram that illustrates a virtualized embodiment of the network node 36 (e.g., the radio access node 14 or a core network node) according to some embodiments of the present disclosure. As used herein, a "virtualized" network node 36 is a network node 36 in which at least a portion of the functionality of the network node 36 is implemented as a virtual component (e.g., via a virtual machine(s) executing on a physical processing node(s) in a network(s)). As illustrated, the network node 36 optionally includes the control system 38, as described with respect to FIG. 10. In addition, if the network node 36 is the radio access node 14, the network node 36 also includes the one or more radio units 46, as described with respect to FIG. 10. The control system 38 (if present) is connected to one or more processing nodes 54 coupled to or included as part of a network(s) 56 via the network interface 44. Alternatively, if the control system 38 is not present, the one or more radio units 46 (if present) are connected to the one or more processing nodes 54 via a network interface(s). Alternatively, all of the functionality of the network node 36 described herein may be implemented in the processing nodes 54. Each processing node 54 includes one or more processors 58 (e.g., CPUs, ASICs, DSPs, FPGAs, and/or the like), memory 60, and a network interface 62.

In this example, functions 64 of the network node 36 (e.g., the functions of the radio access node 14) described herein are implemented at the one or more processing nodes 54 or distributed across the control system 38 (if present) and the one or more processing nodes 54 in any desired manner. In some particular embodiments, some or all of the functions 64 of the network node 36 described herein are implemented as virtual components executed by one or more virtual machines implemented in a virtual environment(s) hosted by the processing node(s) 54. As will be appreciated by one of ordinary skill in the art, additional signaling or communication between the processing node(s) 54 and the control system 38 (if present) or alternatively the radio unit(s) 46 (if present) is used in order to carry out at least some of the desired functions. Notably, in some embodiments, the control system 38 may not be included, in which case the radio unit(s) 46 (if present) communicates directly with the processing node(s) 54 via an appropriate network interface(s).

In some particular embodiments, higher layer functionality (e.g., layer 3 and up and possibly some of layer 2 of the protocol stack) of the network node 36 may be implemented at the processing node(s) 54 as virtual components (i.e., implemented "in the cloud") whereas lower layer functionality (e.g., layer 1 and possibly some of layer 2 of the protocol stack) may be implemented in the radio unit(s) 46 and possibly the control system 38.

In some embodiments, a computer program including instructions which, when executed by the at least one processor 40, 58, causes the at least one processor 40, 58 to carry out the functionality of the network node 36 or a processing node 54 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 60).

Figure 12:
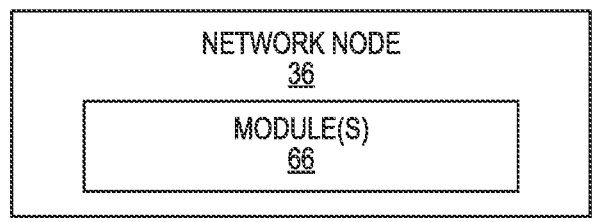

FIG. 12 is a schematic block diagram of the network node 36 (e.g., the radio access node 14 or a core network node) according to some other embodiments of the present disclosure. The network node 36 includes one or more modules 66, each of which is implemented in software. The module(s) 66 provide the functionality of the network node 36 described herein.

Example Embodiments

While not being limited thereto, some example embodiments of the present disclosure are provided below.

Embodiment 1: A method of determining the set of punctured code bit indices (at the output of a Polar encoder) using different puncturing patterns at different code rate regions.

Embodiment 2: A method of embodiment 1 where the different puncturing patterns are derived from two sequences of mutually complementary puncturing patterns.

Embodiment 3: A method of embodiment 2 where both sequences of mutually complementary puncturing patterns split the punctured bit indices in the middle two quarter of all indices but in different directions.

Embodiment 4: A method of operation of an apparatus (e.g., a radio node) that utilizes a Polar encoder, comprising: performing Polar encoding of a plurality of bits to provide a plurality of Polar-encoded code bits; and puncturing the plurality of Polar-encoded code bits using a hybrid puncturing scheme to provide a plurality of rate-matched Polar-encoded code bits, wherein the hybrid puncturing scheme uses different puncturing patterns for different code rate regions.

Embodiment 5: The method of embodiment 4 wherein the different puncturing patterns are mutually complementary puncturing patterns.

Embodiment 6: The method of embodiment 5 wherein puncturing the plurality of Polar-encoded code bits using the hybrid puncturing scheme to provide the plurality of rate-matched Polar-encoded code bits comprises: reordering the plurality of Polar-encoded code bits to provide a plurality of re-ordered Polar-encoded code bits; storing the plurality of re-ordered Polar-encoded code bits in a circular buffer or linear buffer; and extracting the plurality of rate-matched Polar-encoded code bits from the circular buffer or the linear buffer in accordance with one of the different puncturing patterns for one of the different code regions that comprises a desired code rate for the plurality of rate-matched Polar-encoded code bits.

Embodiment 7: The method of embodiment 4 wherein the hybrid puncturing scheme uses a Type I puncturing scheme having a first puncturing pattern for a first code rate region and uses a Type II puncturing scheme having a second puncturing pattern for a second code rate region, the first puncturing pattern and the second puncturing pattern being mutually complementary puncturing patterns.

Embodiment 8: The method of embodiment 7 wherein puncturing the plurality of Polar-encoded code bits using the hybrid puncturing scheme to provide the plurality of rate-matched Polar-encoded code bits comprises: re-ordering the plurality of Polar-encoded code bits to provide a plurality of re-ordered Polar-encoded code bits; storing the plurality of re-ordered Polar-encoded code bits in a circular buffer or linear buffer; and extracting the plurality of rate-matched Polar-encoded code bits from the circular buffer or the linear buffer in accordance with the first puncturing pattern for the Type I puncturing scheme if a desired code rate for the plurality of rate-matched Polar-encoded code bits is within the first code rate region or in accordance with the second puncturing pattern for the Type II puncturing scheme if the desired code rate for the plurality of rate-matched Polar-encoded code bits is within the second code rate region.

Embodiment 9: The method of any one of embodiments 4 to 8 further comprising transmitting the plurality of rate-matched Polar-encoded code bits.

Embodiment 10: An apparatus (e.g., a radio node) that utilizes a Polar encoder, the apparatus adapted to perform the method of any one of embodiments 1 to 9.

Embodiment 11: An apparatus (e.g., a radio node), comprising: a Polar encoder; and circuitry associated with the Polar encoder that, together with the Polar encoder, is operable to perform the method of any one of embodiments 1 to 9.

Embodiment 12: An apparatus (e.g., a radio node) comprising one or more modules operable to perform the method of any one of embodiments 1 to 9.

At least some of the following abbreviations may be used in this disclosure. If there is an inconsistency between abbreviations, preference should be given to how it is used above. If listed multiple times below, the first listing should be preferred over any subsequent listing(s).

3GPP Third Generation Partnership Project
5G Fifth Generation
ASIC Application Specific Integrated Circuit
AWGN Additive White Gaussian Channels
BL/CE Bandwidth reduced Low complexity
CE Coverage Enhanced
CPU Central Processing Unit
CRC Cyclic Redundancy Check
DSP Digital Signal Processor
eNB Enhanced or Evolved Node B
FPGA Field Programmable Gate Array
gNB New Radio Base Station
LDPC Low-Density Parity-Check
LTE Long Term Evolution
LTE-A Long Term Evolution Advanced
ML Maximum-Likelihood
MME Mobility Management Entity
MTC Machine Type Communication
NR New Radio
P-GW Packet Data Network Gateway
SC Successive Cancellation
SCEF Service Capability Exposure Function
SCL Successive Cancellation List
UE User Equipment Those skilled in the art will recognize improvements and modifications to the embodiments of the present disclosure. All such improvements and modifications are considered within the scope of the concepts disclosed herein.

LIST OF REFERENCES

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.
[2] I. Tal and A. Vardy, "List Decoding of polar codes," in Proceedings of IEEE Symp. Inf. Theory, pp. 1-5, 2011.
[3] Leroux, et. al., "A Semi-Parallel Successive-Cancellation Decoder for Polar Codes," IEEE TRANSACTIONS ON SIGNAL PROCESSING, VOL. 61, NO. 2, Jan. 15, 2013.
[4] L. Zhang, et. Al. "On the Puncturing Patterns for Punctured Polar Codes, Proceeding of 2014 IEEE ISIT, pp. 121-125, 2014.
[5] R. Wang and R. Liu, "A Novel Puncturing Scheme for Polar Codes," IEEE Communication Letters vol. 18, No. 12, December 2014.

What is claimed is:

1. A method of operation of a radio node that utilizes a Polar encoder, comprising:
performing Polar encoding of a plurality of bits to provide a plurality of Polar-encoded code bits; and
puncturing the plurality of Polar-encoded code bits using a hybrid puncturing scheme to provide a plurality of rate-matched Polar-encoded code bits;
wherein the hybrid puncturing scheme uses different puncturing patterns for one or more different code rate regions and the different puncturing patterns are mutually complementary puncturing patterns.

2. The method of claim 1 wherein puncturing the plurality of Polar-encoded code bits using the hybrid puncturing scheme to provide the plurality of rate-matched Polar-encoded code bits comprises:
re-ordering the plurality of Polar-encoded code bits to provide a plurality of re-ordered Polar-encoded code bits;
storing the plurality of re-ordered Polar-encoded code bits in a circular buffer or linear buffer; and
extracting the plurality of rate-matched Polar-encoded code bits from the circular buffer or the linear buffer in accordance with one of the different puncturing patterns for one of the different code regions that comprises a desired code rate for the plurality of rate-matched Polar-encoded code bits.

3. The method of claim 2 wherein:
the different puncturing patterns comprise a first puncturing pattern for a first code rate region and a second puncturing pattern for a second code rate region, wherein the first puncturing pattern and the second puncturing pattern are mutually complementary puncturing patterns;
the plurality of Polar-encoded code bits comprises N bits; and
extracting the plurality of rate-matched Polar-encoded code bits from the circular buffer or the linear buffer comprises:
extracting a first M bits from the circular buffer or the linear buffer if the desired code rate for the plurality of rate-matched Polar-encoded code bits is in the first code rate region; and
extracting M bits from the circular buffer or the linear buffer starting at an (N−M)-th bit of the circular buffer or the linear buffer if the desired code rate for the plurality of rate-matched Polar-encoded code bits is in the second code rate region;
wherein M<N.

4. The method of claim 1 wherein the hybrid puncturing scheme uses a first puncturing scheme having a first puncturing pattern for a first code rate region and uses a second puncturing scheme having a second puncturing pattern for a second code rate region, the first puncturing pattern and the second puncturing pattern being mutually complementary puncturing patterns.

5. The method of claim 4 wherein puncturing the plurality of Polar-encoded code bits using the hybrid puncturing scheme to provide the plurality of rate-matched Polar-encoded code bits comprises:
re-ordering the plurality of Polar-encoded code bits to provide a plurality of re-ordered Polar-encoded code bits;
storing the plurality of re-ordered Polar-encoded code bits in a circular buffer or linear buffer; and
extracting the plurality of rate-matched Polar-encoded code bits from the circular buffer or the linear buffer in accordance with the first puncturing pattern for the first puncturing scheme if a desired code rate for the plurality of rate-matched Polar-encoded code bits is within the first code rate region or in accordance with the second puncturing pattern for the second puncturing scheme if the desired code rate for the plurality of rate-matched Polar-encoded code bits is within the second code rate region.

6. The method of claim 4 wherein:
the different puncturing patterns comprise the first puncturing pattern for the first code rate region and the second puncturing pattern for the second code rate region, wherein the first puncturing pattern and the second puncturing pattern are mutually complementary puncturing patterns;

the plurality of Polar-encoded code bits comprises N bits; and puncturing the plurality of Polar-encoded code bits using the hybrid puncturing scheme to provide the plurality of rate-matched Polar-encoded code bits comprises:

re-ordering the plurality of Polar-encoded code bits to provide a plurality of re-ordered Polar-encoded code bits;

storing the plurality of re-ordered Polar-encoded code bits in a circular buffer or linear buffer;

extracting a first M bits from the circular buffer or the linear buffer as the plurality of rate-matched Polar-encoded code bits in accordance with the first puncturing pattern for the first puncturing scheme if a desired code rate for the plurality of rate-matched Polar-encoded code bits is within the first code rate region; and extracting M bits from the circular buffer or the linear buffer starting at an (N−M)-th bit of the circular buffer or the linear buffer as the plurality of rate-matched Polar-encoded code bits in accordance with the second puncturing pattern for the second puncturing scheme if the desired code rate for the plurality of rate-matched Polar-encoded code bits is within the second code rate region;

wherein M<N.

7. The method of claim 1 further comprising transmitting the plurality of rate-matched Polar-encoded code bits.

8. A method of operation of a radio node that utilizes a Polar encoder, comprising:

performing Polar encoding of a plurality of bits to provide a plurality of Polar-encoded code bits;

re-ordering the plurality of Polar-encoded code bits to provide a plurality of re-ordered Polar-encoded code bits;

storing the plurality of re-ordered Polar-encoded code bits in a circular buffer or linear buffer;

extracting a first M bits from the circular buffer or the linear buffer as a plurality of rate-matched Polar-encoded code bits if a desired code rate for the plurality of rate-matched Polar-encoded code bits is within a first code rate region; and extracting a second set of M bits from the circular buffer or the linear buffer as the plurality of rate-matched Polar-encoded code bits if the desired code rate for the plurality of rate-matched Polar-encoded code bits is within the second code rate region.

9. The method of claim 8 wherein:

re-ordering the plurality of Polar-encoded code bits comprises re-ordering the plurality of Polar-encoded code bits in accordance with an ordered sequence that characterizes a first nested sequence of puncturing patterns for the first code rate region;

wherein the first nested sequence of puncturing patterns for the first code rate region and a second nested sequence of puncturing patterns for the second code rate region are mutually complementary.

10. A radio node, comprising:

a Polar encoder operable to perform Polar encoding of a plurality of bits to provide a plurality of Polar-encoded code bits; and circuitry associated with the Polar encoder that is operable to puncture the plurality of Polar-encoded code bits using a hybrid puncturing scheme to provide a plurality of rate-matched Polar-encoded code bits;

wherein the hybrid puncturing scheme uses different puncturing patterns for one or more different code rate regions and the different puncturing patterns are mutually complementary puncturing patterns.

11. A radio node, comprising:

a Polar encoder operable to perform Polar encoding of a plurality of bits to provide a plurality of Polar-encoded code bits; and circuitry associated with the Polar encoder that is operable to:

re-order the plurality of Polar-encoded code bits to provide a plurality of re-ordered Polar-encoded code bits;

store the plurality of re-ordered Polar-encoded code bits in a circular buffer or linear buffer;

extract a first M bits from the circular buffer or the linear buffer as a plurality of rate-matched Polar-encoded code bits if a desired code rate for the plurality of rate-matched Polar-encoded code bits is within a first code rate region; and extract a second set of M bits from the circular buffer or the linear buffer as the plurality of rate-matched Polar-encoded code bits if the desired code rate for the plurality of rate-matched Polar-encoded code bits is within the second code rate region.

12. The radio node of claim 11 wherein the circuitry is further adapted to re-order the plurality of Polar-encoded code bits in accordance with an ordered sequence that characterizes a first nested sequence of puncturing patterns for the first code rate region;

wherein the first nested sequence of puncturing patterns for the first code rate region and a second nested sequence of puncturing patterns for the second code rate region are mutually complementary.

* * * * *

UNITED STATES PATENT AND TRADEMARK OFFICE
CERTIFICATE OF CORRECTION

PATENT NO. : 11,936,402 B2
APPLICATION NO. : 17/322573
DATED : March 19, 2024
INVENTOR(S) : Hui et al.

It is certified that error appears in the above-identified patent and that said Letters Patent is hereby corrected as shown below:

In the Specification

In Column 1, Lines 64-65, delete "$S_{i+1,1} = S_{l,i} \oplus S_{l,i+1}{}^l$ for $l \in \{0,1,\ldots,n-1\}$ and $i \in \{0,1,\ldots,N-1\}$," and insert -- $S_{l+1,i} = S_{l,i} \oplus S_{l,i+2^l}$ for $l \in \{0,1,\cdots,n-1\}$ and $i \in \{0,1,\cdots,N-1\}$, --, therefor.

In Column 6, Line 6, delete "device (UE)" and insert -- (UE) device --, therefor.

In Column 6, Lines 52-53, delete "Additive White Gaussian Channels (AWGN)," and insert -- Additive White Gaussian Noise (AWGN)," --, therefor.

In Column 8, Line 22, delete "4" and insert -- $A_K^N$ --, therefor.

In Column 11, Line 28, delete "Enhanced" and insert -- Enhancement --, therefor.

In Column 15, Line 12, delete "AWGN Additive White Gaussian Channels" and insert -- AWGN Additive White Gaussian Noise" --, therefor.

In Column 15, Line 13, delete "BL/CE Bandwidth reduced Low complexity" and insert -- BL/CE Bandwidth reduced Low complexity/Coverage Enhancement" --, therefor.

In Column 15, Line 14, delete "Enhanced" and insert -- Enhancement --, therefor.

Signed and Sealed this
Eleventh Day of February, 2025

Coke Morgan Stewart
*Acting Director of the United States Patent and Trademark Office*